(12) United States Patent
Gummer (10) Patent No.: US 8,203,356 B2
(45) Date of Patent: Jun. 19, 2012

(54) DEVICE, SYSTEM AND METHOD FOR TESTING AND ANALYZING INTEGRATED CIRCUITS

(75) Inventor: Anthony S. J. Gummer, Nijmegen (NL)

(73) Assignee: NXP B.V., Eindhoven (NL)

( * ) Notice: Subject to any disclaimer, the term of this patent is extended or adjusted under 35 U.S.C. 154(b) by 887 days.

(21) Appl. No.: 11/914,658

(22) PCT Filed: May 12, 2006

(86) PCT No.: PCT/IB2006/051493
§ 371 (c)(1),
(2), (4) Date: Nov. 3, 2008

(87) PCT Pub. No.: WO2006/126130
PCT Pub. Date: Nov. 30, 2006

(65) Prior Publication Data
US 2009/0212796 A1    Aug. 27, 2009

(30) Foreign Application Priority Data
May 27, 2005   (EP) .................................... 05104556

(51) Int. Cl.
*G01R 31/26* (2006.01)
*G01R 31/20* (2006.01)
(52) U.S. Cl. ............................ 324/762.01; 324/754.01
(58) Field of Classification Search ......... 324/762.01–9, 324/754.01–6, 755.01–755.11, 756.01–756.07; 257/48; 438/14–18
See application file for complete search history.

(56) References Cited

U.S. PATENT DOCUMENTS

| | | | |
|---|---|---|---|
| 5,489,852 A | 2/1996 | Gomez et al. | |
| 5,656,943 A | 8/1997 | Montoya et al. | |
| 6,127,833 A | 10/2000 | Wu et al. | |
| 6,292,006 B1 | 9/2001 | Fredrickson | |
| 6,462,570 B1 * | 10/2002 | Price et al. | 324/756.02 |
| 6,620,731 B1 * | 9/2003 | Farnworth et al. | 438/667 |
| 7,088,118 B2 * | 8/2006 | Liu et al. | 324/756.03 |
| 7,514,946 B2 * | 4/2009 | Soeta et al. | 324/750.09 |
| 2004/0056675 A1 | 3/2004 | Markert et al. | |

* cited by examiner

*Primary Examiner* — Jermele M Hollington
*Assistant Examiner* — Tung X Nguyen (57) ABSTRACT

This invention relates to a semiconductor device for testing and analyzing integrated circuits (1) on a first side and a second side. The semiconductor device (1) having a first surface (A1) and a second surface (A2) both sides having a set of contacts (P3a, P3b, P3a', P3b'). The sets of contacts on are symmetrically located on positions relative to a first fictitious plane of symmetry (S1) and a second fictitious plane of symmetry (S2). The semiconductor device (1) has at least a first position of use and a second position of use, whereby the second position of use is obtained by rotating the semiconductor device (1) in the first position of use 180° around a fictitious axis (M). This axis (M) is defined by the crossing of the first fictitious plane of symmetry (S1) and the second fictitious plane of symmetry (S2). The semiconductor device thus obtained provides a flexible and generic solution for testing and analyzing integrated circuits on both sides.

12 Claims, 11 Drawing Sheets

DEVICE, SYSTEM AND METHOD FOR TESTING AND ANALYZING INTEGRATED CIRCUITS

The invention relates to a device for testing and analysing integrated circuits on a first side and a second side thereof.

The invention also relates to a system for testing and analysing integrated circuits on a first side and a second side thereof, wherein the system comprises such a device.

The invention further relates to a method for testing and analysing integrated circuits on a first side and a second side thereof, in which the device according to the invention is used.

A device of this type is known from U.S. Pat. No. 6,127, 833. This document describes a semiconductor test carrier including an insulating substrate having a top surface, a bottom surface, and periphery; with a rectangular cavity centrally located on the top surface and extending through to the bottom surface. A conductive ground trace formed on the top surface at the periphery of the cavity with conductive corner power traces formed adjacent each corner of the ground trace, with a ruled pattern of conductive wire bond pads encircling the corner power traces. Wire bond pads are formed in a linear array on each of the four sides encircling the power traces. A first interstitial ball pad array encircles the conductive wire bond pads and connects with the bottom surface by way of conductive vias communicating with a second interstitial ball pad array at the bottom surface. A glass plate is attached to the underside of the insulated substrate to form a bottom supporting surface in the rectangular cavity. A semiconductor device is placed in the cavity and its backside adhesively bonded to the glass plate. The appropriate input/output terminals of the device are connected to appropriate wire bond pads and traces on the top surface of the substrate with metallurgically bonded conductive wire. The exposed ends of the wires are encapsulated with a sealing polymer.

The problem with the known device is that it is only suitable for testing and analyzing integrated circuit prototypes. The device forms as it were a single-use packaging for integrated circuits which is not suitable for use in products. So, once they have been packaged as such, the integrated circuits can no longer be used in products, which means that they can be thrown away after they have been tested and analyzed.

It is an object of the invention to provide a device of the type defined in the opening paragraph by means of which it is possible to analyze and test in their usual packaging both at the front side and at the back side.

According to the invention this object is achieved by means of a device having a first side and a second side having a first imaginary plane of symmetry perpendicular to the first side of the device, the device further comprising a set of signal conductors and on both sides of the device a set of signal contacts, the set of signal contacts on the second side of the device being located at mirrored positions relative to the set of signal contacts on the first side of the device and the sets of signal contacts on both sides of the device being symmetrically positioned relative to the first imaginary plane of symmetry.

Thanks to said measures it has become possible to mount an integrated circuit with a conventional package. The symmetry of the device as regards the positions of the signal contacts, and the accessibility from both sides of the device further make possible to mount the device in two positions of use in a test system. For that matter, when mounting the device in the second position of use the signal contacts are found at positions that match positions of the signal contacts in the first position of use. Thus in the one position of use the first side of the integrated circuit can be tested and analyzed and in the other position of use the second side of the integrated circuit can be tested and analyzed. So there is no need for making a test package to test and analyze the integrated circuits.

An additional advantage of the device according to the invention is that it is also suitable for testing and analyzing integrated circuits that have been returned by customers because there were problems with them.

Further is should be observed that the invention with its generic layout makes possible a wide range of tests and analyses that require physical access on the first side (for example at the front), on the second side (for example at the back) or on both sides of the integrated circuit. Hereinbelow will be given a non-limiting summing up of possible tests and analyses:

Functional tests and debug tests with ATE (Automatic Test Equipment, such as for example an Agilent 93000 system);
  Optical imaging with a microscope;
  Laser-based analyzing techniques such as:
  LVP (Laser Voltage Probing);
  SDL (Soft Defect Localization);
  RIL (Resistive Interconnect Localization);
  DLS (Dynamic Laser Scanning);
  Photon-Emission-Based analyzing techniques, such as:
  SPE (Static Photon Emission);
  Time-Resolved-Emission measurements (for example with the help of an EMI scope);
  PICA (Picosecond Imaging Circuit Analysis)
  E-beam probing
  etcetera.

In an improved embodiment of the device according to the invention the device is characterized in that it has a set of power supply contacts, the set of power supply contacts on the second side of the device being located at mirrored positions relative to the set of power supply contacts on the first side of the device and the sets of power supply contacts on both sides of the device also being symmetrically located relative to the first imaginary plane of symmetry. The advantage of this embodiment is that it is more suitable for installing the integrated circuit on two sides of the device. For that matter, when mounting the device in the second position of use, also the power supply contacts are found at positions that match positions of the power supply contacts in the first position of use.

The device according to the invention is preferably characterized in that the device has a set of ground contacts, the set of ground contacts on the second side of the device being at mirrored positions relative to the set of ground contacts on the first side of the device, and the sets of ground contacts on both sides of the device also being symmetrically positioned relative to the first imaginary plane of symmetry. The advantage of this embodiment is that no additional measures are necessary any more for connecting the contacts in the second positions of use, because all contacts are now located at symmetrical positions.

In a first variant of the said embodiment of the device according to the invention the device is characterized in that the positions of the set of signal contacts on the second side of the device and the positions of the set of signal contacts on the first side of the device are each other's mirror image relative to a second imaginary plane of symmetry, which is located in the middle of the device and runs parallel with the first side of the device. In this first variant the positions of the contacts in the first position of use and the second position of use coincide. A signal contact will always be found at the position of a signal contact; a power supply contact will always be found at the original position of a power supply contact and a ground contact will always be found at the original position of a ground contact. So the great advantage of this variant is that all connections from, for example an integrated circuit tester to the contacts of the device can remain unchanged in both the first and the second position of use.

In a second variant of said embodiments of the device according to the invention the device is characterized in that the positions of the set of signal contacts on the second side of the device and the positions of the set of signal contacts on the first side of the device are each other's mirror image relative to an imaginary axis which is defined by the intersecting line of the first imaginary plane of symmetry and the imaginary plane that is located in the middle of the device and runs parallel with the first side of the device. Due to this measure the device has the property of having exactly the same position of each contact in both positions of use of the device. That is why this variant has a second great advantage in addition to the advantage of the first variant. All stimuli offered to the device may continue to be offered to the same contacts. In the first variant it could be necessary to exchange stimuli by exchanging the software of stimuli on different channels. This additional measures have become completely redundant in the second variant. Thus there is no need to change anything at all in the second position of use.

A further improvement on previously mentioned embodiments is obtained if at least one of the four nearest contacts of a signal contact from the set of signal contacts is a power supply contact. An improvement of these same embodiments is obtained in analogous manner if at least one of the four nearest contacts of a signal contact from the set of signal contacts is a ground contact. Both said measures make possible to couple each signal contact, if desired, to ground potential or power potential via the direct electrical connection. This measure is also called hard-wiring.

In a further improvement of said embodiment a signal conductor belonging to a signal contact from the first set of signal contacts and a signal contact from the second set of signal contacts is electrically connected to a further signal conductor, which further signal conductor is electrically connected to a further signal contact located on one side of the device, at least one of the four nearest contacts of the further signal contact being a power supply contact or a ground contact. This embodiment is advantageous in that providing a direct hard-wire between the signal contacts and a power supply contact or a ground contact can be moved to areas of the device where there is more room. For it may happen that there is physically no room for such an electrical connection. In other cases such a direct electrical connection may be in the way of two positions of use relative to the installation of the device. In both cases the invented embodiment defined here offers a solution.

The invention also relates to a system for testing and analyzing integrated circuits on a first side and a second side, characterized in that the system forms a generic part and a part specific of classes of integrated circuits, which specific part comprises a device as claimed in one of the preceding claims. This system is advantageous in that it is suitable for testing an analyzing integrated circuits on a first side and a second side while only one specific part is necessary.

An extension to the embodiment mentioned above is characterized in that the system comprises a connection means having electrical contacts for receiving an integrated circuit on the first side of the integrated circuit, which connection means is installed on the first side of the device and the electrical contacts of the connection means are electrically interconnected to the contacts on the device. This is advantageous in that a connection means can be chosen that matches the integrated circuit to be tested and analyzed. This measure can render the device suitable for specific integrated circuits.

For that matter, integrated circuits may differ in their number of contacts and the positions of the contacts. In addition, the packaging of the integrated circuits is dependent on the application.

The system according to the invention is preferably characterized in that the system has an aperture that extends through both the device and the connection means for rendering the first side of the integrated circuit accessible from the second side of the device. This double-sided accessibility is of major importance for various tests and analyses.

The invention further relates to a method for testing and analyzing integrated circuits on their first and second sides. The method utilizes the device according to the invention and comprises the following steps:
  installing an integrated circuit on the device;
  mounting the device in a first position of use;
  executing a first test or analysis of the integrated circuit;
  mounting the device in a second position of use;
  executing a second test or analysis of the integrated circuit;
the second position of use of the device being obtained by rotating the device from the first position of use through 180° around an imaginary mirror axis which is defined by the intersecting line of the first imaginary plane of symmetry and a further imaginary plane that is situated in the middle of the device and runs parallel with the first side of the device.

The method according to the invention provides a flexible and generic solution for testing and analyzing integrated circuits on two sides. This requires only one specific part, which results in not only a simpler method but also a more cost-effective one. Besides, the method has the additional advantage that because of its generic structure it works out faster than current methods for measuring integrated circuits, which in its turn is advantageous for the time-to-market.

The method is preferably characterized in that the device in both the first position of use and the second position of use is mounted on a generic part. The advantage of the use of a generic part is that they are reasonably standardized in the market and, as a result, can be connected to testers in a simple manner.

These and further aspects of the device, system and method according to the invention will be further explained with reference to the drawing Figures, in which.

Figure 1A:
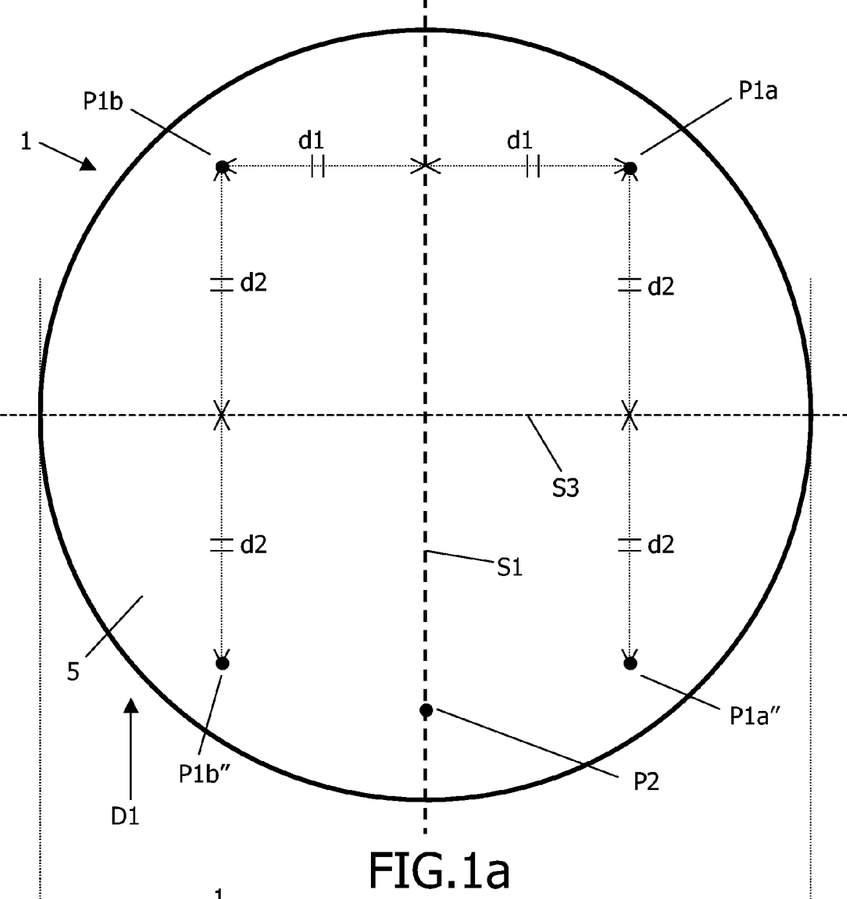
FIG. 1a is a schematic plan view to illustrate the principle of the device according to the invention.
Figure 1B:
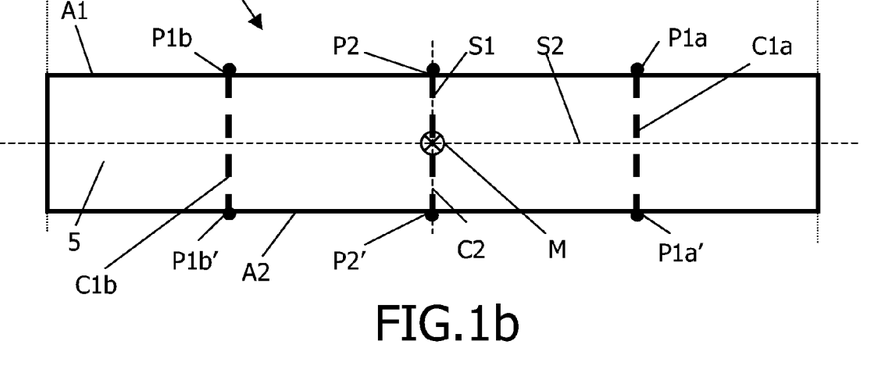
FIG. 1b shows a schematic side view of the device of FIG. 1a seen from direction D1.

In FIG. 1a and FIG. 1b the basis principle of the invention is explained with reference to a schematic representation of the plan view of the device according to the invention. The device 1 comprises a carrier 5 on two sides of which A1, A2 contacts P1a, P1b, P2, P1a', P1b', P2' are provided. The carrier 5 may be for example a printed circuit board (PCB). In the present example the carrier 5 has a round shape (not essential) having an 8 inch diameter and a thickness of about 3 mm.

Contacts are meant to be understood as the terminals to which a test system (not shown) can be connected either or not through certain interfaces. A test system may also comprise a tester such as for example the Agilent 93000. These contacts may be hollow or protrude from the surface or a combination of the two. The contacts P1a, P1b, P2, P1a', P1b', P2' may be signal contacts, but also for example power supply contacts or ground contacts. In the elaborated examples of this description the carrier 5 always has a round shape, but this is not essential. On the other hand, it is important indeed for the carrier 5 to have a first imaginary plane of symmetry (in FIG. 1a and FIG. 1b this plane is defined by the dashed lines S1) concerning the position of the contacts P1a, P1b, P2, P1a', P1b', P2'. The shape of the carrier 5 need not be symmetrical relative to the plane of symmetry S1 as long as the device 5 can be mounted in two positions of use via the contacts P1a, P1b, P2, P1a', P1b', P2'. The contacts P1a and P1 bare equidistant d1 to the plane of symmetry S1. Contact P2 has the particular property of being in the plane of symmetry S1 and therefore being equal to its mirror image. At least the contacts P1a, P1b, P2 used for a test or analysis on the first side A1 of the device 1 preferably also have and associated contact P1a', P1b', P2 on the second side A2 of the device 1 to which they are connected via the signal conductors C1a, C1b, C2. The positions of the contacts P1a', P1b', P2' on the second side A2 of the device 1 should be located on mirrored positions relative to the contacts P1a, P1b, P2 on the first side A1 of the device 1. In the present example in FIG. 1b said contacts are mirrored on both sides relative to a second imaginary plane of symmetry S2, which extends in the middle of the carrier parallel with the two sides A1, A2. As will be evident later on in the description there are also further options. FIG. 1b shows the device 1 seen from the direction D1. The device 1 has two positions of use, the second position of use of the device 1 being obtained by having it rotate in the first position of use through 180° relative to an imaginary axis M. Later on in this description this will be discussed in more detail. In the example contact P1b' will then end at the original position of contact P1a and contact P1a' at the original position of contact P1b. Obviously, it is essential for both contact P1a and contact P1b to be of the same type, for example a signal contact, so that for example only the signals on contacts P1a and P1b need exchanging to proceed with the test or analysis. It may be observed that the connections to the device 1 can remain unchanged. The adaptation would only be an adaptation of the software (and therefore a minor adaptation) if a tester were used. If both contacts P1a and P1b are for example a power supply contact or a ground contact, nothing needs to be done to proceed with the test or the analysis.

It should further be observed that the device may also comprise a set of contacts that are not arranged symmetrically relative to the first imaginary plane of symmetry S1. A set of contacts may also be present on the first side A1 of the device 1, without a corresponding set of contacts of the second side A2 of the device 1.

In addition, it is in the line of the inventive thought that as regards the positions of the contacts there may be various planes of symmetry, for example the plane S3 in FIG. 1. FIG. 1 is an illustration hereof for the contacts P1a and P1b. The contacts P1a and P1b" are equidistant d2 to the plane of symmetry S3 and as are the contacts P1b and P1b" equidistant d2 to the plane of symmetry S3. The consequence of such a double symmetry is that the device obtains more posu, which may be advantageous in some situations.

Figure 2A:
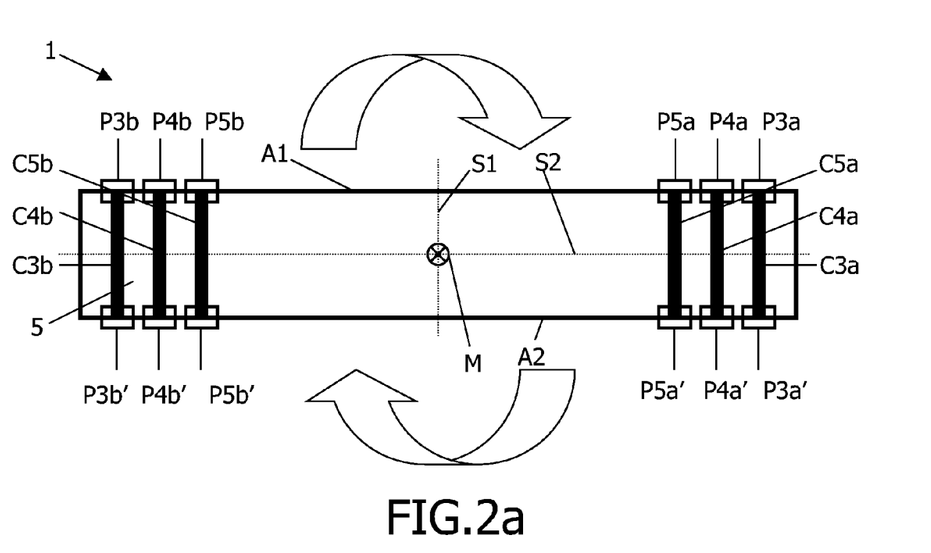
FIG. 2a shows a schematic side view of a first embodiment of the device of FIG. 1a seen from direction D1.
Figure 2B:
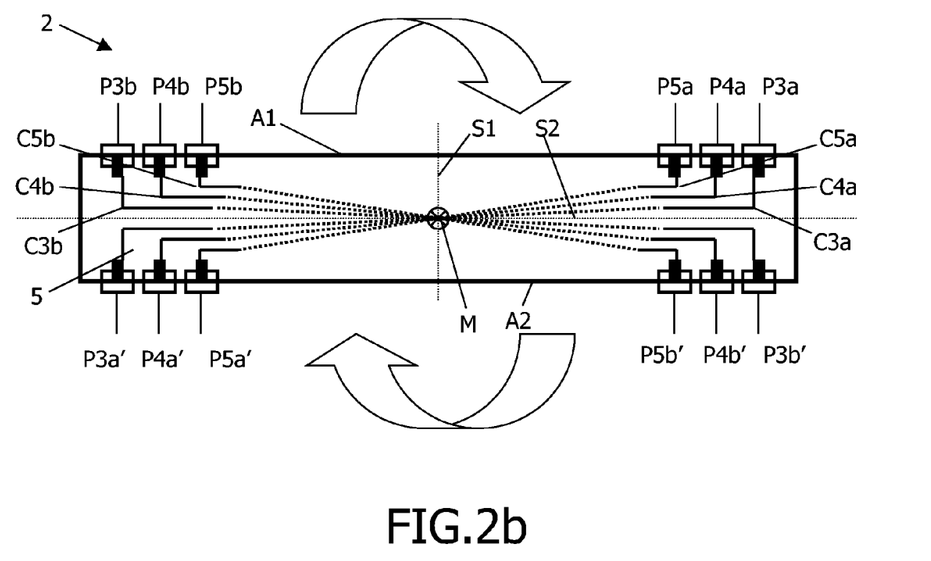
FIG. 2b shows a schematic side view of a second embodiment of the device of FIG. 1a seen from direction D1.

FIG. 2a and FIG. 2b illustrate in more detail the two basic embodiments of the invention according to the invention. FIG. 2a and FIG. 2b do not show for clarity the signal conductors that connect the contacts P3a, P4a, P5a, P3b, P4b, P5b to an integrated circuit to be tested and analyzed.

In the first basic embodiment in FIG. 2a the sets of contacts on either one of the two sides A1, A2 of the device 1 are found at mirrored positions relative to the second imaginary plane of symmetry S2 that runs parallel with the surfaces A1 and A2. Let us assume that the device 1 is mounted in the second position of use while the second position of use of the device 1 is obtained by rotating the device 1 through 180° relative to an imaginary axis M, which axis M is defined by the intersecting line of the first imaginary plane of symmetry S1 and the second imaginary plane of symmetry S2 that is situated in the middle of the device 1 and runs parallel with the first side A1 of the device 1. Then the contacts P3a, P4a, P5a, P5b, P4b, P3b are found, for example, that the terminals (not shown) at the contacts P3a, P4a, P5a in the second position of use are physically connected to other signal conductors C3b, C4b, C5b. If the sets of contacts for example P3a, and their mirroring relative to the first imaginary plane of symmetry S1, for example P3b, are of the same type, for example signal contacts, nothing needs to be changed as regards hardware in the test array (not shown) in the second position of use of the device. It could at most be necessary to exchange the signals that are offered on the two signal contacts P3a, P3b. This can be implemented in a simple manner on a tester in a test program (software).

In the second basic embodiment in FIG. 2b the sets of contacts are found on either one of the two sides A1, A2 of the device 2 at mirrored positions relative to the imaginary axis M. This embodiment is highly advantageous because in the second position of use the terminals (not shown) at the contacts P3a, P4a, P5a, P3b, P4b, P5b in the second position of use are physically connected to the same signal conductors C3a, C4a, C5a, C3b, C4b, C5b. This is the case because in the carrier 5 the signal conductors are connected to the contacts mirrored relative to the axis M. This means that in the second position of use of the device 2 nothing needs to be changed in the test array (not shown) both as regards hardware and software.

In the first basic embodiment in FIG. 2a the signal conductors C3a, C4a, C5a, C3b, C4b, C5b are shown as solid conductors. Naturally it is also possible for these conductors to be hollow so that a connection contact (not shown) can be completely passed through the device 1 or that the conductors and contacts are one, extending completely through the device 1 and then possibly forming protrusions to serve as contacts. Finally it should be observed that also mixtures of the two basic embodiments are possible.

Figure 3A:
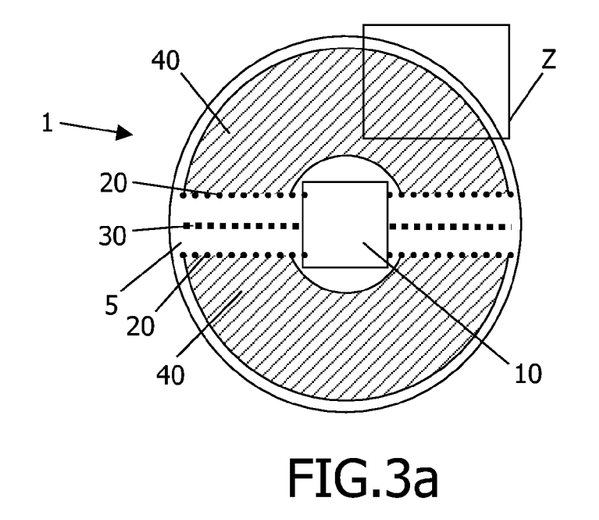
FIG. 3a and FIG. 3b show an elaborated example of an embodiment of the device of the invention.

FIG. 3a gives a more detailed schematic view of an embodiment of the device 1 according to the invention, also in view of the locations of the various types of contacts (signal contacts, power supply contact and ground contacts) on the carrier 5. In this embodiment the signal contacts are located in the signal contact areas 40 which are located in a mirrored fashion relative to an imaginary plane of symmetry, which in this example intersects the device at the ground contact areas 30 where the ground contacts are provided. Further, power supply contacts are provided in the power supply contact as 20 which are also located in a mirrored fashion relative to an imaginary plane of symmetry. The carrier 1 further has an aperture 10 extending through the carrier 5. This aperture 10 is necessary to render the semiconductor device (not shown) accessible for testing and analyzing on the side facing the device 1. A bonding agent (not shown) may be provided around the aperture 10, on which agent the semiconductor device can then be accommodated. This semiconductor device should then also have an aperture at the position of the aperture 10 in the carrier 5.

Figure 3B:
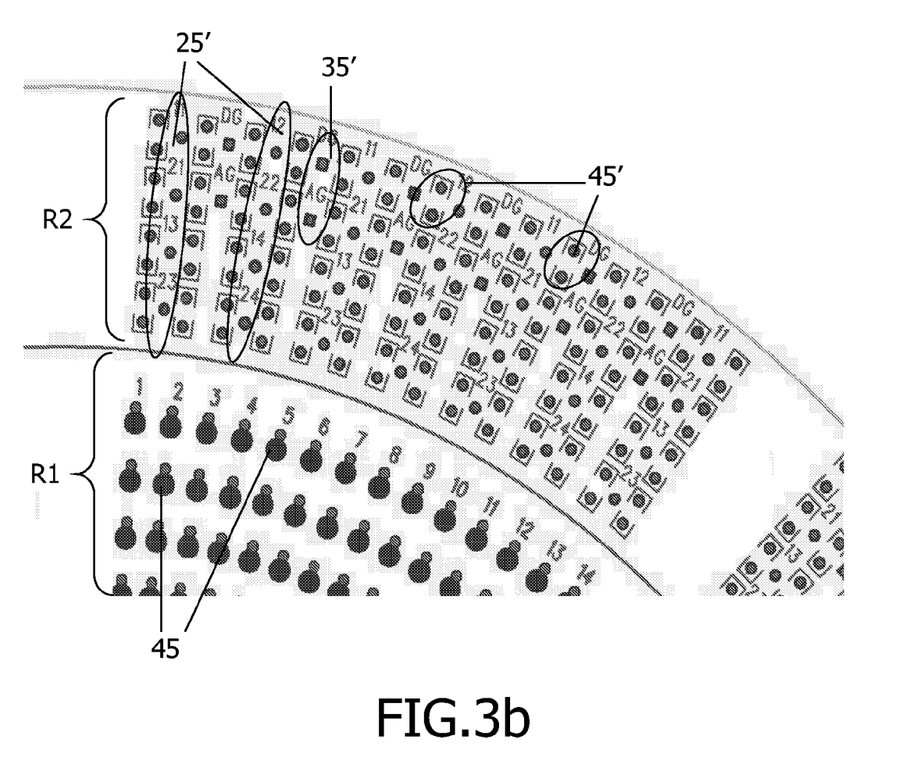

FIG. 3b shows an enlargement Z of sca 40 of the device 1. In this example the sca 4 has two sub-areas R1 and R2. In sub-area R1 are the signal contacts 45 which are intended for making a connection to (an interface of) a test system (not shown). On the inside the signal contacts 45 are connected to signal contacts (not shown) on the other side of the device 1 via signal conductors (not shown). Sub-area R2 accommodates the further signal contacts 45', which are connected, via further signal conductors, to the signal conductors associated to the signal contacts 45. Power supply contacts 25' and ground contacts 35' are deposited on the carrier 5 in sub-area R2 close to the further signal contacts 45'. This measure makes possible to couple the further signal contacts 45' (and hence the original signal contacts 45) for example direct to the ground potential or the power potential. This is also referred to as hard-wiring by the man of ordinary skill in the art. In the example under discussion, there is more room in sub-area R2 for the use of ground contacts 35', power supply contacts 25' and for making direct connections between the further signal contacts 45' and the ground contacts 35' and power supply contacts 25' than there is in sub-area R1. This makes the embodiment attractive. Besides, for the accessibility of the signal contacts 45 on both sides in sub-area R1 it is advantageous to make the direct connections in a sub-area R2 that is located outside the sub-area R1. As a result the signal contacts 45 continue to be physically better accessible in this sub-area R1.

Figure 4A:
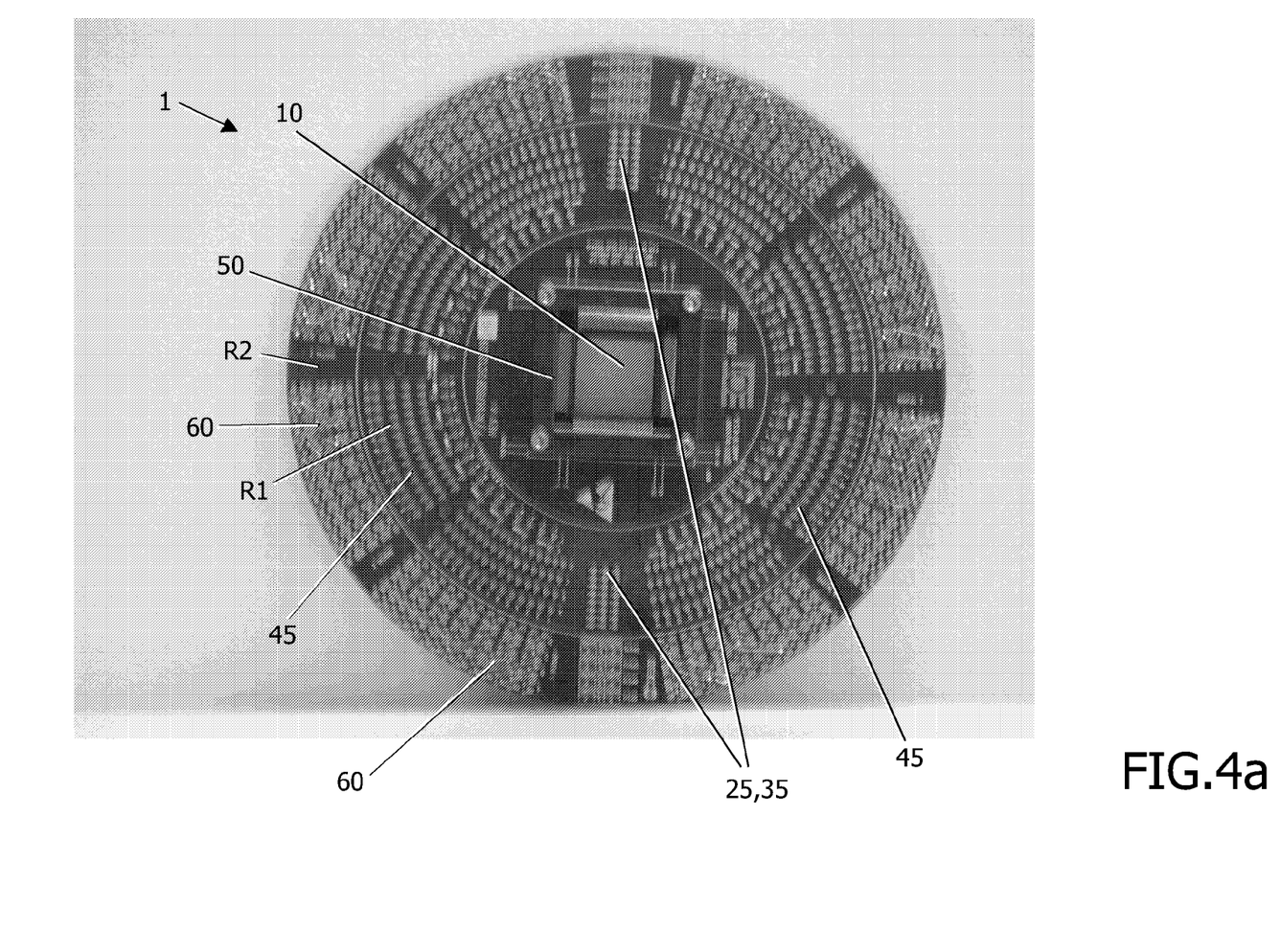
FIG. 4a shows a photograph of the first side of an embodiment of the device according to the invention.
Figure 4B:
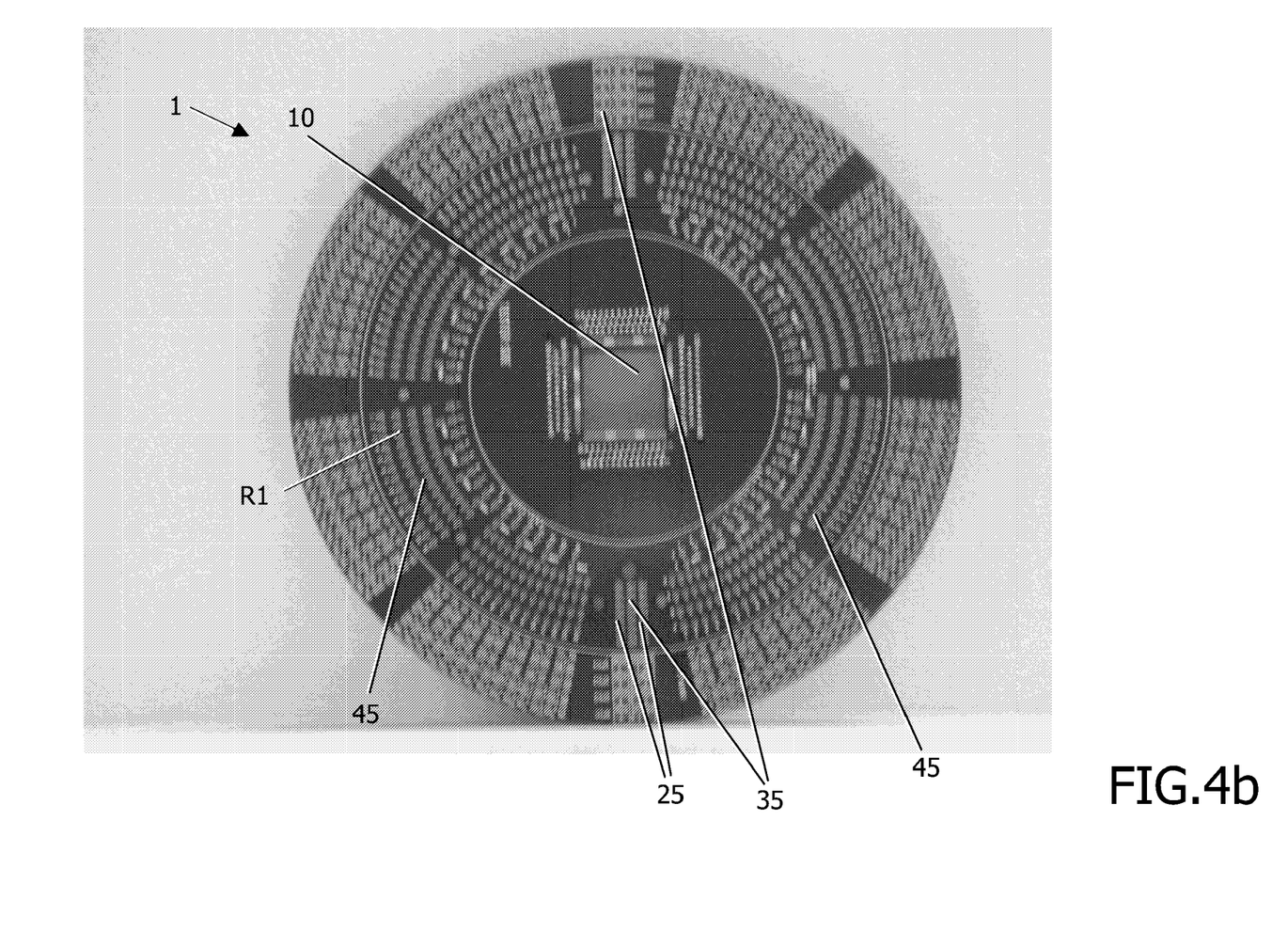
FIG. 4b shows a photograph of the second side of an embodiment of the device according to the invention.

FIG. 4a and FIG. 4b show the first side and second side respectively of the device 1 according to the invention. FIG. 4a shows a connection means 50 applied around the aperture 10. This connection means 50 is also referred to by the expert as an IC socket and is intended for receiving an integrated circuit. The thickness of the connection means 50 is 7 to 12 mm in the present example. FIG. 4a further shows the direct hard wires 60 in sub-area R2. The power contacts 25 and ground contacts 35 are positioned symmetrically relative to an imaginary plane of symmetry which, perpendicularly to the device intersects the imaginary line through the ground contacts 35. If an integrated circuit is deposited on the connecting means 50, with conventional packaging for integrated circuits, the upper side of the integrated circuit can be easily accessed by removing the top of the packaging. FIG. 4b shows the second side of the device 1. If an integrated circuit is deposited on the connecting means 50, the under side of the integrated circuit is accessible through the aperture 10. The upper side of the integrated circuit is here intended to be understood as the side on which the transistors and connections are deposited. In some types of packaging the integrated circuit is packed such that this side is directed toward the external connections of the packaging (for example in the case of flip-flop bonding of ball-grid array types of packaging) and in other cases the integrated circuit is directed with just the other side (mostly the substrate side) to the external connections of the packaging (for example with conventional wire bonding types of packaging).

Figure 5A:
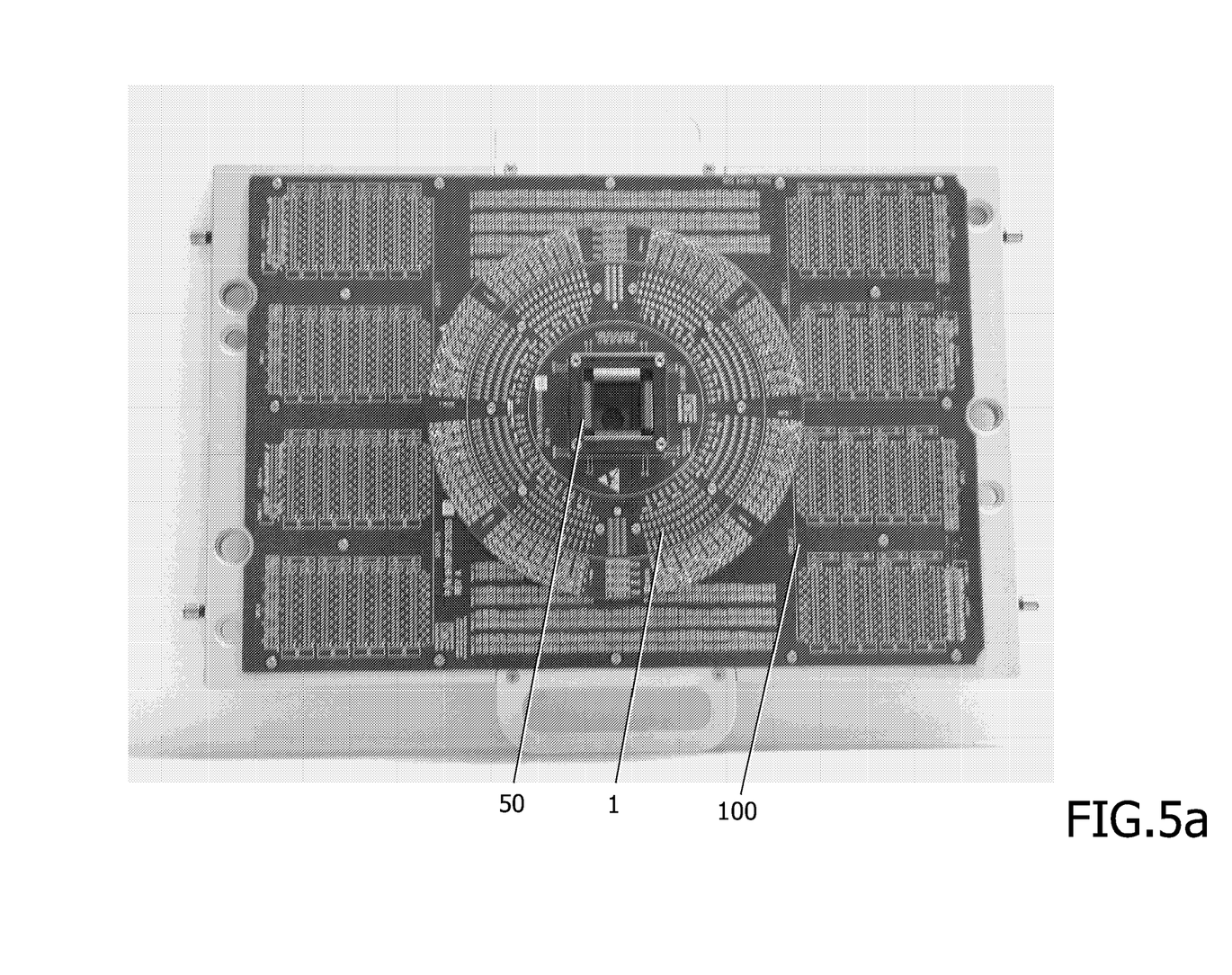
FIG. 5a shows a photograph of a plan view of a system according to the invention with the system, in a first position of use, mounted on a generic part.
Figure 5B:
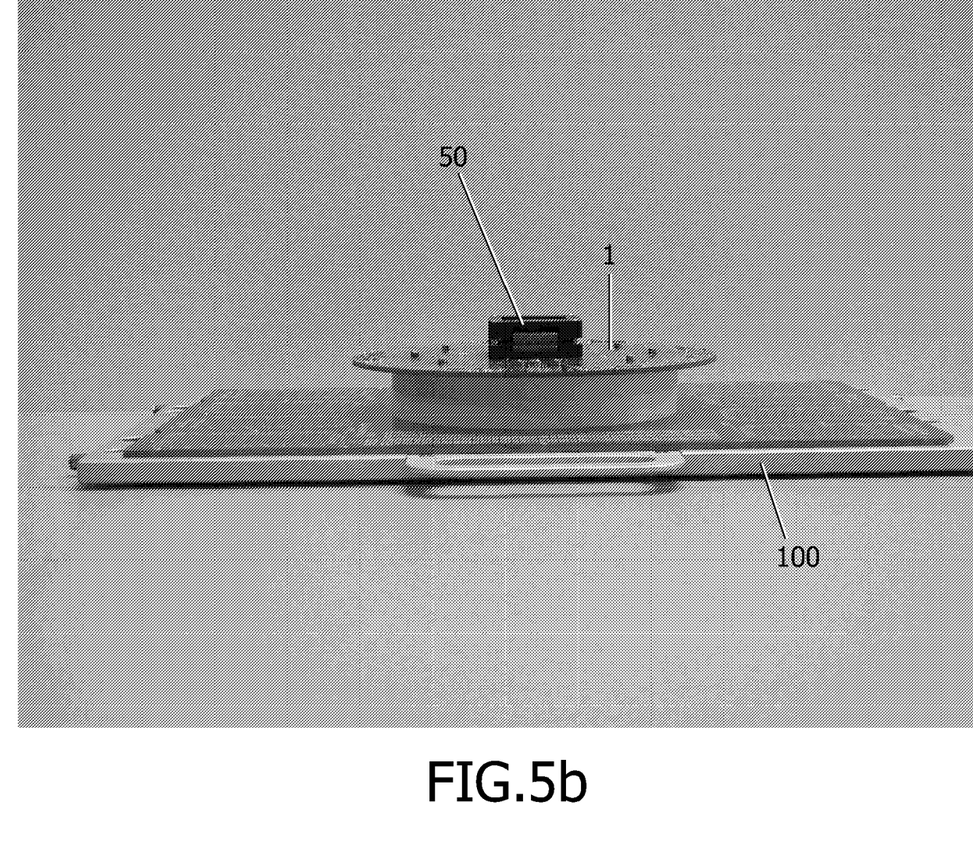
FIG. 5b shows a photograph of a side view of a system according to the invention with the system, in a first position of use, mounted on a generic part.
Figure 6A:
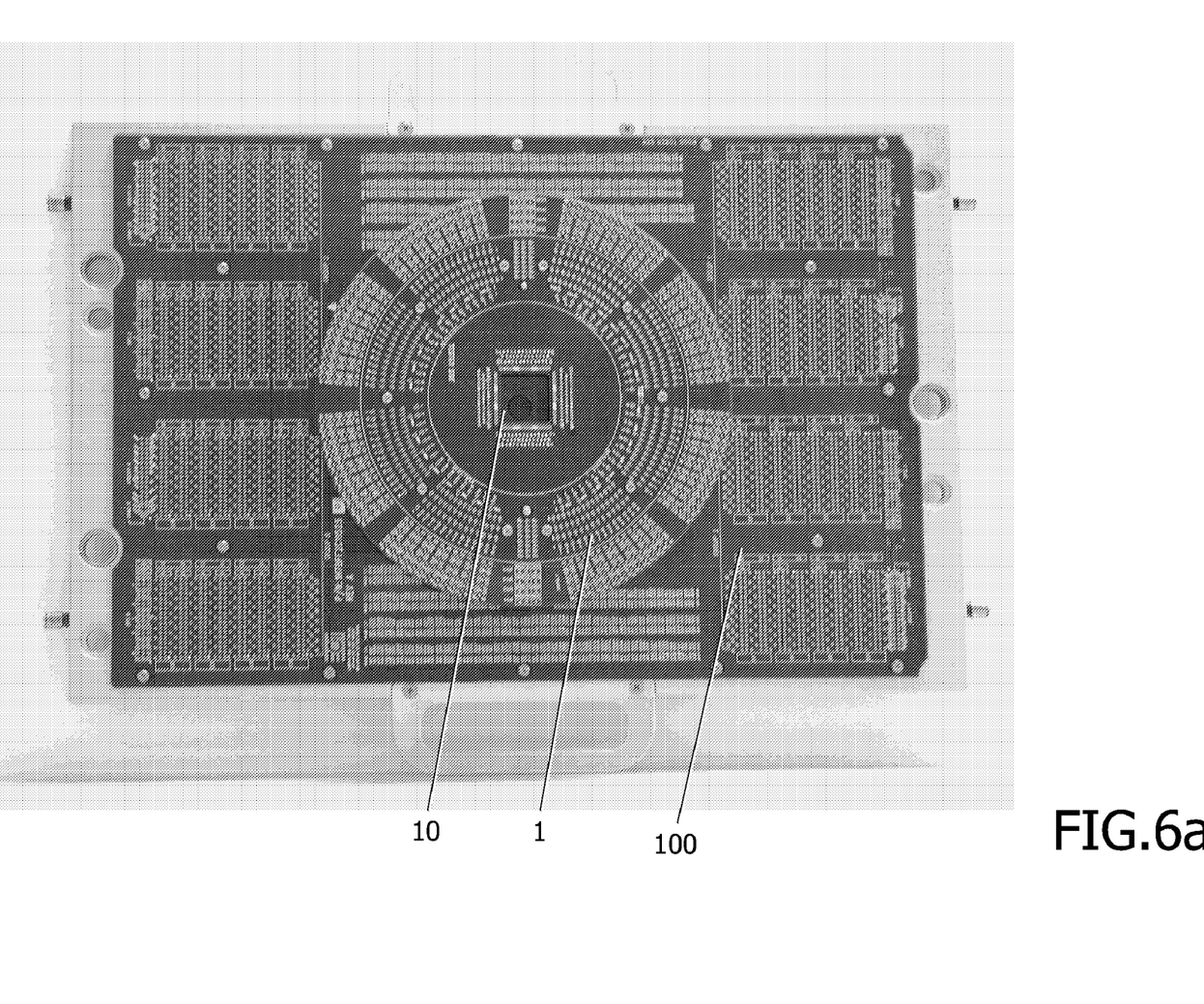
FIG. 6a shows a photograph of a plan view of a system according to the invention with the system, in a second position of use, mounted on a generic part.
Figure 6B:
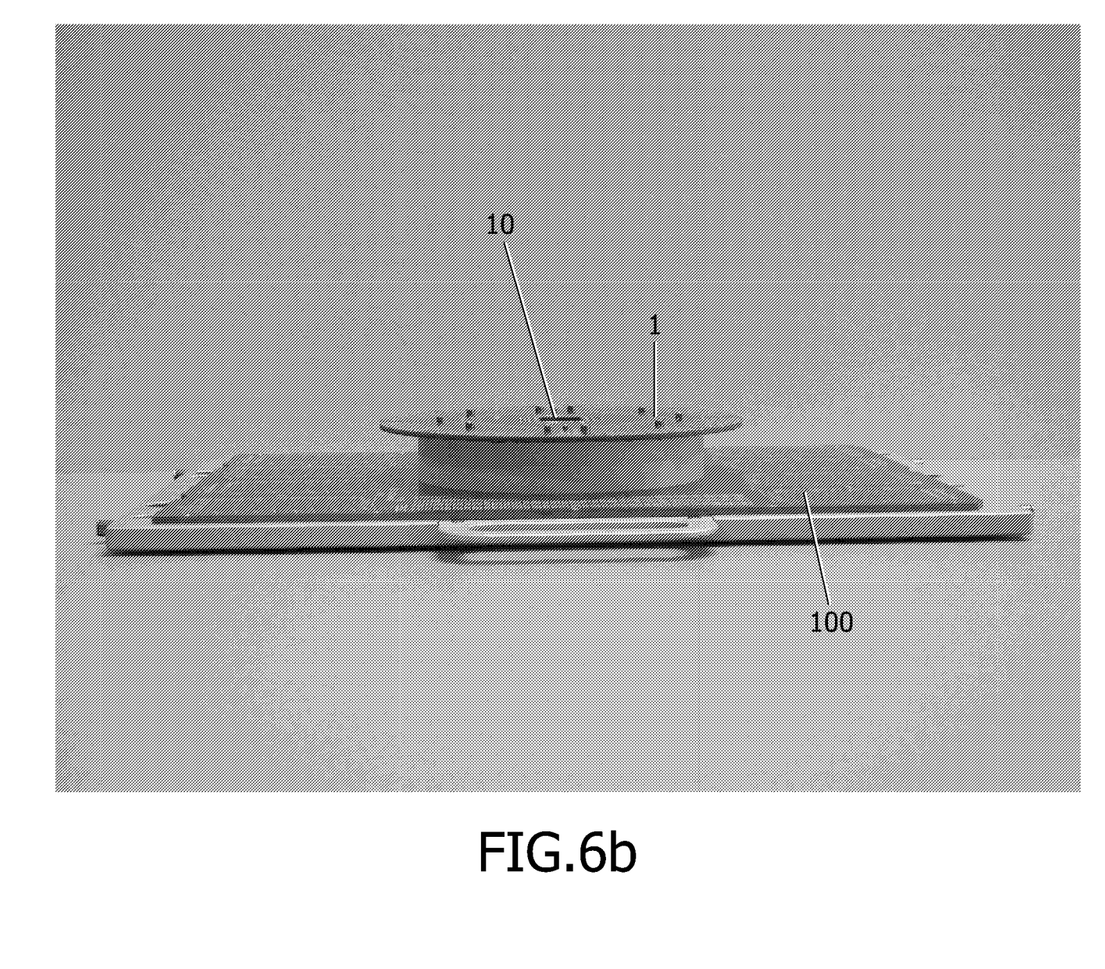
FIG. 6b shows a photograph of a side view of a system according to the invention with the system, in a second position of use, mounted on a generic part.

FIG. 5a and FIG. 5b show respectively a plan view and a front view of the device 1 according to the invention with this device 1, in a first pou, being mounted on a generic component part 100. FIG. 6a and FIG. 6b show respectively a plan view and a front view of the device 1 according to the invention with this device 1, in a second pou, being mounted on a generic component part 100. The generic part 100 can then be connected to a tester (not shown). The generic part 100 shown in these Figures is arranged for a direct connection to a tester, also called direct docking. In some measurements and analyses this device is preferred.

Figure 7A:
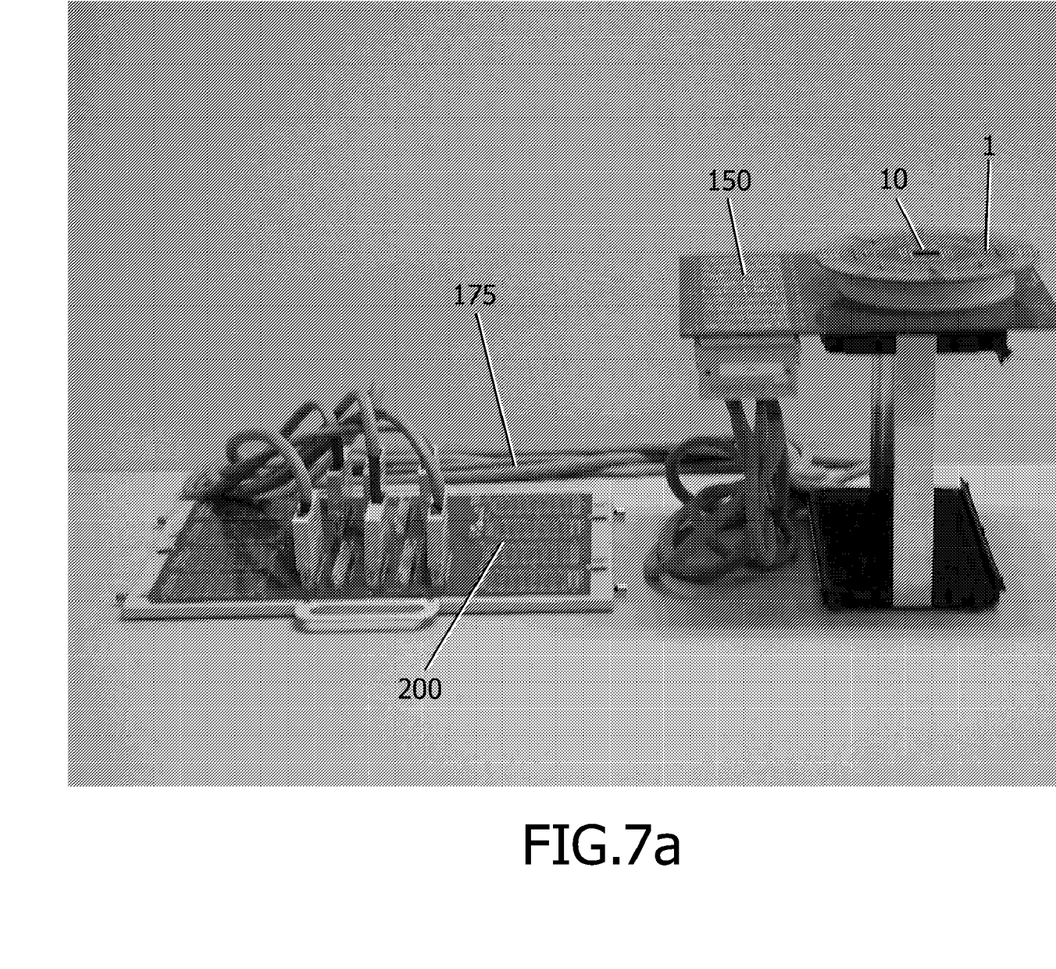
FIG. 7a shows a photograph of a system according to the invention with the system, in a first position of use, mounted on an alternative generic part.
Figure 7B:
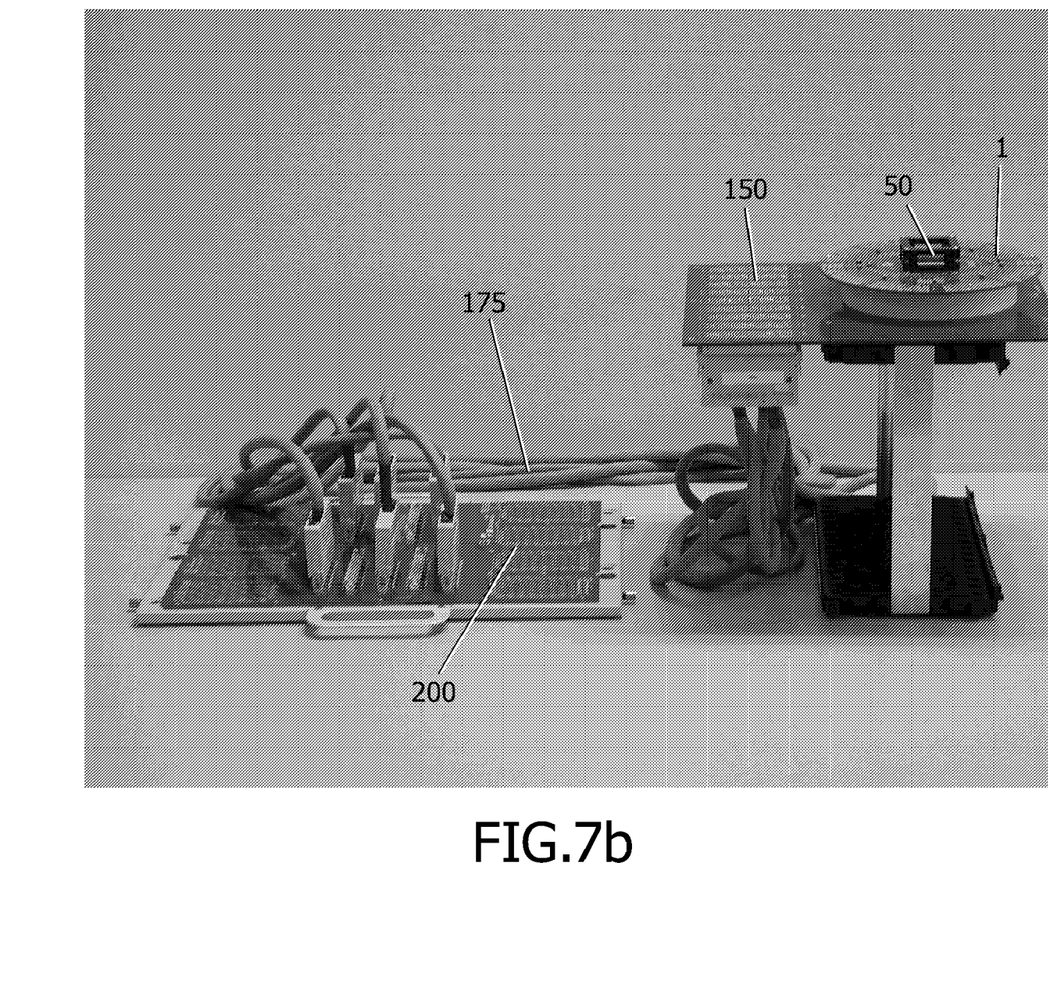
FIG. 7b shows a photograph of a system according to the invention with the system, in a second position of use, mounted on an alternative generic part.

FIG. 7a and FIG. 7b show another array, that is, the array in which the device 1 in the first and second position of use respectively is mounted on an interface of an analyzing device 150. This interface 150 is connected through cables 175 to a generic part 200 which in its turn can be connected to a tester.

All Figures in this description are shown merely schematic and furthermore not to scale. They have been used to elucidate the embodiments and technical background intended with the invention. Boundary faces in the Figure may in reality have other forms than represented in the drawing. Obviously, any person skilled in the art will be capable of designing novel embodiments of this invention. However, they fall within the scope of the present claims.

A possible variant of the examples given in this description relates to said types of contacts. Besides power supply contacts and ground contacts there are also other substantially analog contacts, which for example are to provide supply voltages or back-bias voltages on the integrated circuit. The term signal contacts is also understood to mean contacts that are meant for carrying clock signals, trigger signals, handshake signals etcetera. These variants do not in any way harm the inventive idea and therefore fall under the claims.

The invention claimed is:

1. A device for testing and analyzing integrated circuits having a first side and a second side with a first imaginary plane of symmetry perpendicular to the first side of the device, the device further comprising a set of signal conductors and on both sides of the device a set of signal contacts, the set of signal contacts on the second side of the device being located at mirrored positions relative to the set of signal contacts on the first side of the device and the sets of signal contacts on both sides of the device being symmetrically positioned relative to the first imaginary plane of symmetry, the device including a connector to receive an integrated circuit so that the integrated circuit is installed on the first side of the device.

2. A device as claimed in claim 1, characterized in that the device has a set of power supply contacts, the set of power supply contacts on the second side of the device being located at mirrored positions relative to the set of power supply contacts on the first side of the device and the sets of power supply contacts on both sides of the device also being symmetrically located relative to the first imaginary plane of symmetry.

3. A device as claimed in claim 1, characterized in that the device has a set of ground contacts, the set of ground contacts on the second side of the device being at mirrored positions relative to the set of ground contacts on the first side of the device, and the sets of ground contacts on both sides of the device also being symmetrically positioned relative to the first imaginary plane of symmetry.

4. A device as claimed in claim 1, characterized in that the positions of the set of signal contacts on the second side of the device and the positions of the set of signal contacts on the first side of the device are each other's mirror image relative to a second imaginary plane of symmetry, which is located in the middle of the device and runs parallel with the first side of the device.

5. A device as claimed in claim 1, characterized in that the positions of the set of signal contacts on the second side of the device and the positions of the set of signal contacts on the first side of the device are each other's mirror image relative to an imaginary axis which is defined by the intersecting line of the first imaginary plane of symmetry and an imaginary plane that is located in the middle of the device and runs parallel with the first side of the device.

6. A device as claimed in claim 1, characterized in that at least one of the four nearest contacts of a signal contact from the set of signal contacts is a power supply contact.

7. A device as claimed in claim 1, characterized in that at least one of the four nearest contacts of a signal contact from the set of signal contacts is a ground contact.

8. A device as claimed in claim 1, wherein the connector is an integrated circuit socket.

9. A device as claimed in claim 8, further comprising an aperture extending both through the device and the connector for making the first side of the integrated circuit accessible from the second side of the device.

10. A system for testing and analyzing integrated circuits on a first side and a second side, characterized in that the system forms a generic part and a specific part specifically for classes of integrated circuits, which specific part comprises a device having a first side and a second side with a first imaginary plane of symmetry perpendicular to the first side of the device, the device further comprising a set of signal conductors and on both sides of the device a set of signal contacts, the set of signal contacts on the second side of the device being located at mirrored positions relative to the set of signal contacts on the first side of the device and the sets of signal contacts on both sides of the device being symmetrically positioned relative to the first imaginary plane of symmetry, the system comprising an analyzing device that includes an interface on which the device is mounted to the analyzing device, the interface of the analyzing device being configured so that the device is mounted in a first position of use so that a first test or analysis of an integrated circuit is executed, the interface of the analyzing device being further configured so that the device is mounted in a second position of use so that a second test or analysis of the integrated circuit is executed, the second position of use of the device being obtained by rotating the device from the first position of use through 180° around an imaginary mirror axis which is defined by the intersecting line of the first imaginary plane of symmetry and a further imaginary plane that is situated in the middle of the device and runs parallel with the first side of the device.

11. A method for testing and analyzing integrated circuits and utilizing a device having a first side and a second side with a first imaginary plane of symmetry perpendicular to the first side of the device, the device further comprising a set of signal conductors and on both sides of the device a set of signal contacts, the set of signal contacts on the second side of the device being located at mirrored positions relative to the set of signal contacts on the first side of the device and the sets of signal contacts on both sides of the device being symmetrically positioned relative to the first imaginary plane of symmetry, comprising the following steps:
   installing an integrated circuit on the device;
   mounting the device in a first position of use;
   executing a first test or analysis of the integrated circuit;
   mounting the device in a second position of use; and
   executing a second test or analysis of the integrated circuit;
   the second position of use of the device being obtained by rotating the device from the first position of use through 180° around an imaginary mirror axis which is defined by the intersecting line of the first imaginary plane of symmetry and a further imaginary plane that is situated in the middle of the device and runs parallel with the first side of the device.

12. A method as claimed in claim 11, characterized in that the device in both the first position of use and the second position of use is mounted on a generic part.

* * * * *